United States Patent [19]
Koons

[11] Patent Number: 5,534,074
[45] Date of Patent: Jul. 9, 1996

[54] VERTICAL BOAT FOR HOLDING SEMICONDUCTOR WAFERS

[75] Inventor: John J. Koons, Georgetown, Tex.

[73] Assignee: Heraeus Amersil, Inc., Duluth, Ga.

[21] Appl. No.: 442,999

[22] Filed: May 17, 1995

[51] Int. Cl.[6] .................................................. C23C 16/00
[52] U.S. Cl. .......................... 118/728; 118/500; 206/454; 211/41; 427/248.1
[58] Field of Search .................................. 118/500, 728; 211/41; 206/454; 427/248.1

[56] References Cited

U.S. PATENT DOCUMENTS

| | | | |
|---|---|---|---|
| 947,880 | 2/1910 | Babington | 206/259 |
| 1,739,037 | 12/1929 | Louthan | 206/259 |
| 3,226,254 | 12/1965 | Reuschel | 427/86 |
| 4,184,841 | 1/1980 | Robinson et al. | 206/258 |
| 4,504,224 | 3/1985 | Hewitt | 206/258 |
| 4,653,636 | 3/1987 | Armstrong | 206/337 |
| 4,669,612 | 6/1987 | Mortensen | 206/454 |
| 4,872,554 | 10/1989 | Quernemoen | 206/454 |
| 5,054,418 | 10/1991 | Thompson | 118/500 |
| 5,169,453 | 12/1992 | Takagi | 118/728 |
| 5,169,684 | 12/1992 | Takagi | 427/248.1 |
| 5,192,371 | 3/1993 | Shuto | 118/728 |

*Primary Examiner*—R. Bruce Breneman
*Assistant Examiner*—Jeffrie R. Lund
*Attorney, Agent, or Firm*—Finnegan, Henderson, Farabow, Garrett & Dunner

[57] ABSTRACT

A vertical boat comprises a plurality of rods extending vertically in parallel from a base. Each rod has a plurality of slots cut along the length of the respective rod. The slots of each rod are vertically aligned with the slots of the other rods and have top and bottom surfaces that are peaked. The rods are arranged so that a wafer can be jointly received by a corresponding slot from each rod, thereby allowing the boat to hold the wafers in a stack with both sides of the wafers exposed.

13 Claims, 3 Drawing Sheets

VERTICAL BOAT FOR HOLDING SEMICONDUCTOR WAFERS

BACKGROUND OF THE INVENTION

1. Field of the Invention

The present invention relates to semiconductor wafer processing. More particularly, the present invention relates to vertical boats for holding semiconductor wafers during processing with minimum contact.

2. Description of the Related Art

Semiconductor wafers are conventionally processed by exposing surfaces of the wafers to gas in a high-temperature furnace. To maximize the amount of surface area exposed, wafers are carried in "boats". These boats may comprise parallel rods having slots evenly spaced along the length of the rods. Typically, the slots in one rod are aligned with the slots of the other rods so that a wafer can be jointly received by a corresponding slot from each rod. By placing wafers in the appropriate slots of the rods, the boat can carry a stack of wafers. The spacing between the slots along the rods separates the wafers from each other so that both sides of the wafers are exposed.

FIG. 1 illustrates a conventional boat 100, which comprises three rods 110 vertically extending from a base 120. As shown in FIG. 1, wafers 130 are held horizontally in the slots of rods 110. Rod 110 is shown in greater detail in FIG. 2, which illustrates rod 110 as having slots 112 evenly spaced along the length of rod 110. Slots 112 have top and bottom surfaces, designated by reference numerals 114 and 116, respectively. These surfaces are flat and substantially perpendicular to axis 118 of rod 100 (shown as a dotted line). Bottom surfaces 116 make planar surface contact with wafers placed in the respective slots.

These conventional slots, however, prevent portions of the wafer surfaces from being processed. For example, because the portions of the wafers contacting surfaces 116 remain covered, these portions are not exposed to the gas during processing and thus are not processed. Also, in some cases, top surfaces 114 may contact the wafer surfaces or otherwise prevent exposure to the gas, thereby preventing processing of those parts. This problem, known as "shadowing," results in valuable portions of the wafers not being processed, thereby reducing the amount of wafer surface area usable for semiconductor fabrication.

SUMMARY OF INVENTION

Accordingly, it is an object of the invention to obviate one or more of the problems resulting from limitations and disadvantages of the related art.

It is another object of the invention to minimize the amount of shadowing caused by vertical boats on wafers.

It is a further another object of the invention to minimize the amount of contact between semiconductor wafers and the vertical boat used to carry the wafers.

It is still another object of the invention to provide lines of contact between the rods of a vertical boat and wafers, rather than planes of contact.

It is yet another object of the invention to increase the amount of wafer surface area usable for semiconductor fabrication.

It is yet a further object of the invention to minimize wafer contamination caused by contact with boat material.

To achieve these and other objects and in accordance with the purpose of the invention, as embodied and broadly described, the invention includes a vertical boat for holding semiconductor wafers, comprising a base and at least three rods extending vertically in parallel from the base. Each rod has a plurality of slots cut along the length of the respective rod and each slot has at least one peaked surface. The slots are aligned so that a wafer can be jointly received by a corresponding slot from each rod, thereby allowing the boat to hold the wafers in a stack with both sides of the wafers exposed.

In another aspect, the invention includes a method of processing wafers in a vertical boat that include at least three parallel rods extending vertically, whereby each rod includes a plurality of slots cut along the length of the respective rod. Each slot includes a bottom surface that is peaked. The slots are aligned so that a wafer can be jointly received by a corresponding slot from each rod. The method comprises the steps of providing a stack of wafers in the vertical boat by setting wafers in the slots of the boat, placing the vertical boat in a high-temperature furnace, setting the temperature of the furnace to a desired temperature, and exposing the vertical boat and wafers to gas.

It is to be understood that both the foregoing general description and the following detailed description are exemplary and explanatory and are intended to provide further explanation of the invention as claimed.

BRIEF DESCRIPTION OF THE DRAWINGS

The accompanying drawings are included to provide a further understanding of the invention and are incorporated in and constitute a part of this specification, illustrate preferred embodiments of the invention, and, together with the description, serve to explain the principles of the invention. In the drawings.

DETAILED DESCRIPTION

The vertical boat of the invention includes vertically extending rods having slots with peaked surfaces, rather than flat surfaces. Preferably, both the top and bottom surfaces of the slots are peaked. These slots provide minimal contact between the rods and the wafers, thereby decreasing the amount of shadowing.

Figure 1:
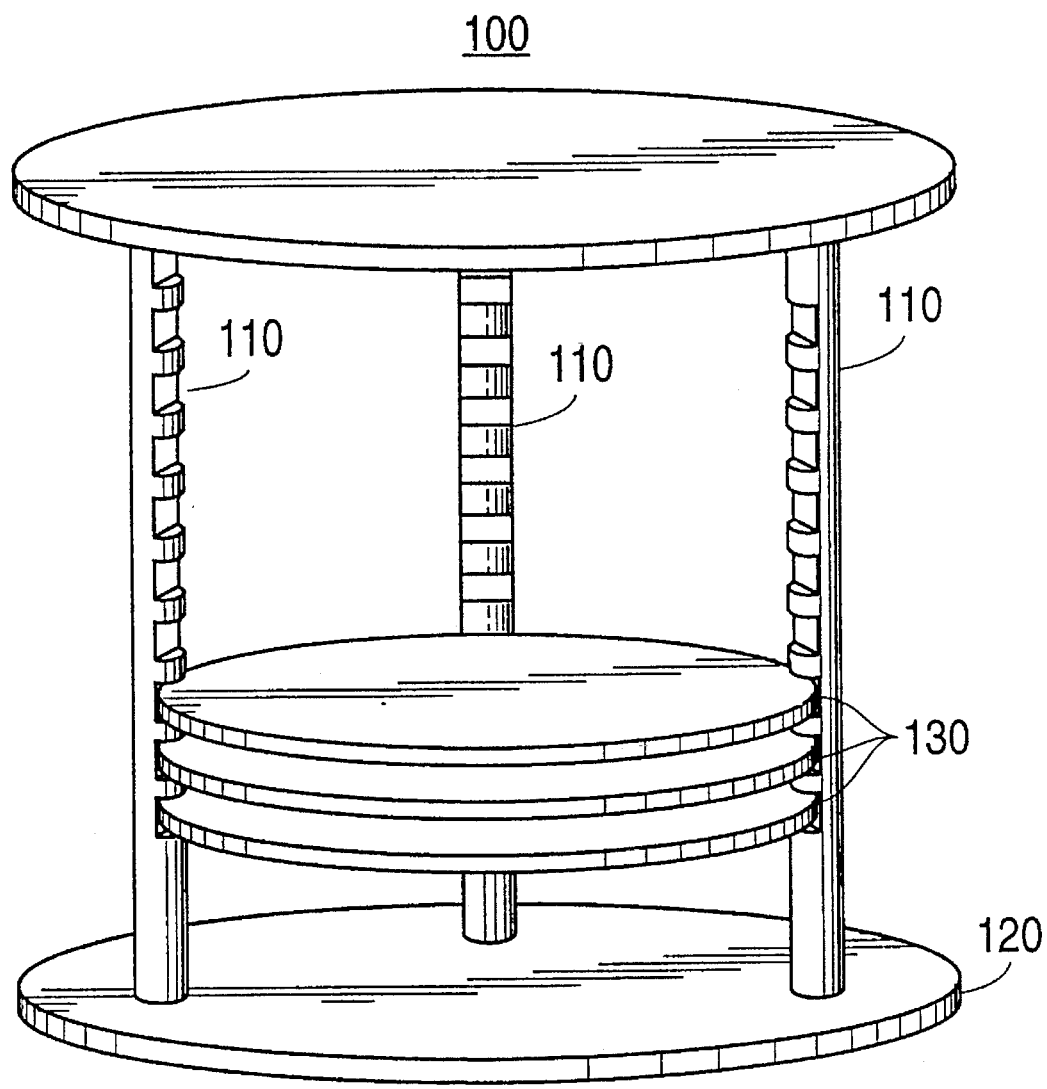
FIG. 1 is a perspective view of a conventional three-rod vertical boat.
Figure 2:
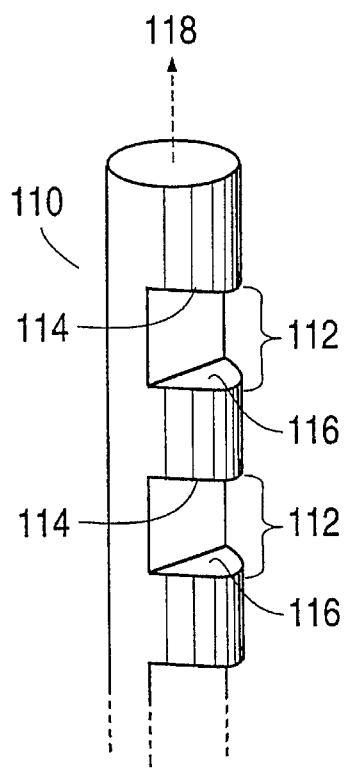
FIG. 2 is a perspective view of part of a slotted rod of the vertical boat shown in FIG. 1.
Figure 3:
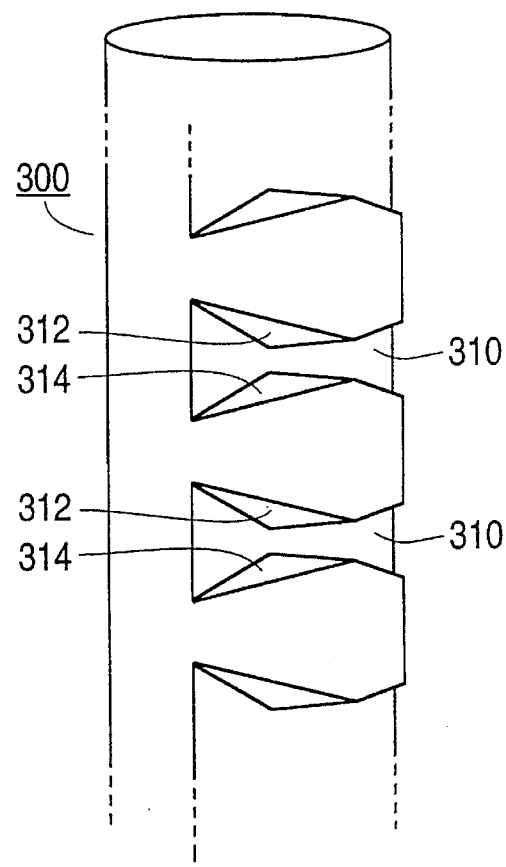
FIG. 3 is a perspective view of part of a slotted rod in accordance with a first embodiment of the invention.

FIG. 3 illustrates part of a slotted rod 300 in accordance with a first embodiment of the invention. Rod 300 is preferably a cylindrical rod preferably made of fused quartz, though any known material suitable for holding wafers during wafer processing may be used. Slots 310 are formed along the length of rod 300 and spaced apart such that the wafers set in slots 310 are adequately separated to expose both sides of the wafers during processing. The spacing between slots 310 can vary based upon design considerations, but is preferably small to maximize the number of wafers that can be held by a vertical boat incorporating rod 300.

As shown in FIG. 3, slots 310 have peaked top and bottom surfaces, designated by reference numerals 312 and 314, respectively. The top surface 312 is downwardly V-shaped and bottom surface 314 is upwardly V-shaped, both peaking substantially in the middle of the respective surfaces. The depth of slots 310 can be determined based upon design considerations, as is within the skill of one of ordinary skill in the art. Preferably, slots 310 are somewhat shallow to minimize the amount of shadowing, yet deep enough to support the wafers.

The slots 310 may be formed using precision cutting machines, such as a computer numeric-controlled diamond blade slotter. For example, the slotter could form a slot 310 by cutting opposing diagonal grooves to form an "X." The spacing between adjacent wafers once loaded in the boat is determined by the angle of diagonal cuts. If desired, one or more cuts perpendicular to the rod axis can be made at or near the "X" to facilitate wafer loading and remove unnecessary material from the bottom of the wafer supports.

Figure 4:
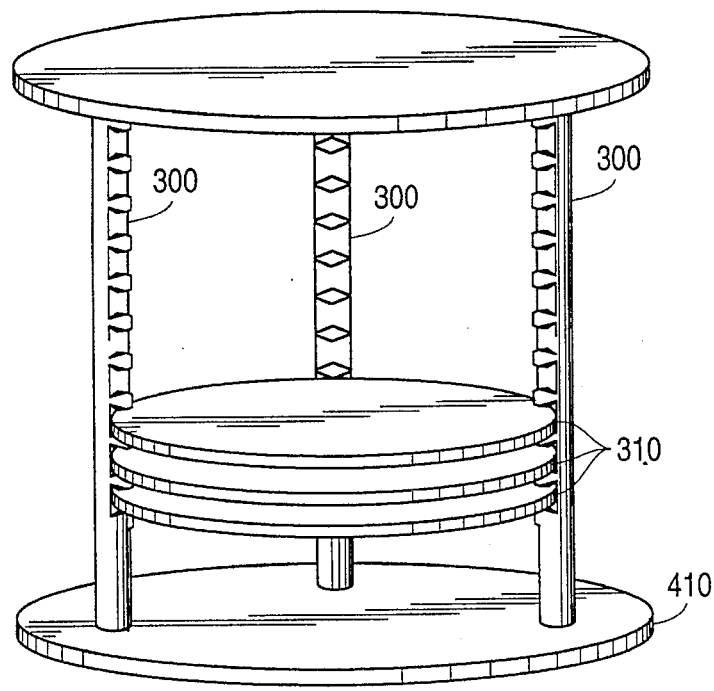
FIG. 4 is a perspective view of a three-rod vertical boat including slotted rods similar to the one shown in FIG. 3.

FIG. 4 shows a three-rod vertical boat 400 having three rods 300 vertically extending from base 410. Wafers 130 slide into slots 310 and rest on apexes of peaked surfaces 314 (FIG. 3), which provide narrow lines of contact with the wafers, thereby minimizing the amount of shadowing on wafers 130.

Once a stack of wafers are set in vertical boat 400, vertical boat 400 can be placed in a high-temperature furnace and the wafers processed in accordance with conventional techniques (i.e., boat 400 and the wafers held therein exposed to gas at high temperatures).

In an alternative embodiment, rods 300 could be vertically mounted along interior walls of an enclosure, such as a reaction tube, which would then be placed in a high-temperature furnace, or even along interior walls of the high-temperature furnace itself. By mounting the rods in the high-temperature furnace, wafers could be set directly in or removed directly from the furnace without the need for a separate holder, like a vertical boat.

Figure 5:
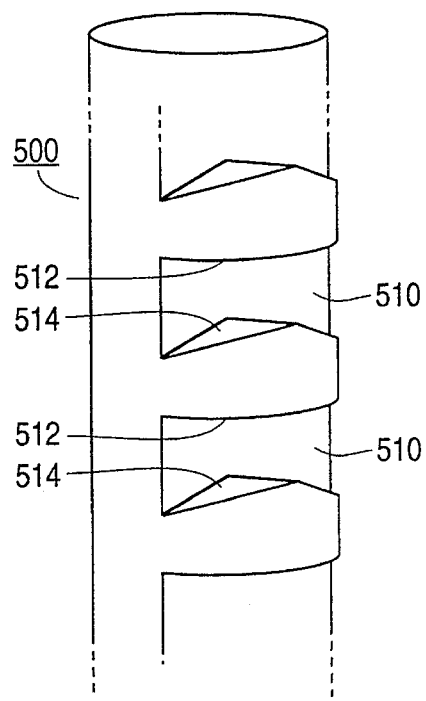
FIG. 5 is a perspective view of part of a slotted rod in accordance with a second embodiment of the invention.

FIG. 5 shows part of a rod 500 in accordance with a second embodiment of the invention. Rod 500 is similar to rod 300 described above, except that rod 500 has slots 510 instead of slots 310. As shown in FIG. 5, slots 510 have top surfaces 512 that are flat and substantially perpendicular to the axis of rod 500 and bottom surfaces 514 which are similar to bottom surfaces 314. Like slots 310, slots 510 can be formed using precision cutting machines. A vertical boat (not shown) can be assembled using several rods 500 in a similar manner as rods 300 are used in vertical boat 400 shown in FIG. 4 or, alternatively, rods 500 can be mounted along interior walls of an enclosure as described above.

It will be apparent to those skilled in the art that various modifications and variations can be made in the vertical boat of the invention without departing from the spirit or scope of the invention. For example, instead of having three rods as described above, the vertical boat of the invention could have more than three rods (e.g., four-rod boat, five-rod boat, etc.). Thus, it is intended that the present invention cover the modifications and variations of this invention provided they come within the scope of the appended claims and their equivalents.

I claim:

1. A vertical boat for holding semiconductor wafers, comprising:

a plurality of support members, each having at least one slot cut perpendicular to axis extending longitudinally through the support member, each slot having at least one peaked surface, wherein the slots are aligned so that a wafer can be jointly received by a corresponding slot from each member, thereby allowing the boat to hold the wafers in a stack with both sides of the wafers exposed, wherein each support member, respective slots, and respective peaked surfaces are monolithic, and wherein peaks of the peaked surfaces extend radially from the support members.

2. The vertical boat according to claim 1, wherein said support members include at least three vertically-mounted parallel rods.

3. The vertical boat according to claim 2, wherein the rods comprise fused quartz.

4. The vertical boat according to claim 2, wherein the boat comprises four vertically-mounted parallel rods.

5. The vertical boat according to claim 1, wherein a bottom surface of each slot is peaked.

6. The vertical boat according to claim 5 wherein the wafers held by the boat rest on apexes of the bottom surfaces of the slots.

7. The vertical boat according to claim 5, wherein a top surface of each slot is peaked.

8. A method of processing wafers in a vertical boat including at least three rods extending vertically in parallel, each rod having a plurality of slots cut perpendicular to an axis extending longitudinally through the respective rod, each slot having a bottom surface that is peaked, peaks of the peaked surfaces extending radially from the rods, the slots aligned so that a wafer can be jointly received by a corresponding slot from each rod, each rod, respective slots, and respective peaked bottom surfaces are monolithic, comprising the steps of:

providing a stack of wafers in the vertical boat by setting wafers in the slots of the boat;

placing the vertical boat in a high-temperature furnace;

setting the temperature of the furnace to a desired temperature; and exposing the vertical boat and wafers to gas.

9. The method according to claim 8, wherein the wafers rest on apexes of the peaked bottom surfaces.

10. The method according to claim 8, wherein an upper surface of each slot is peaked.

11. The method according to claim 8, wherein the rods comprise fused quartz.

12. The method according to claim 8, wherein the boat comprises four rods.

13. A vertical boat for holding semiconductor wafers, comprising:

a plurality of monolithic support members arranged to be disposed along a periphery of said wafers, each of said support members having at least two corresponding slots spaced vertically along each of the support members, the slots being cut along an axis extending longitudinally through the support member, each slot having a peaked surface extending radially relative to each of the support members; wherein the slots are aligned so that the boat holds the wafers in a stack, the wafers only being supported along the peaked surfaces of each of the slots, thereby allowing both sides of the wafers to be substantially fully exposed.

\* \* \* \* \*